(12) United States Patent
Fujisawa

(10) Patent No.: US 7,893,515 B2
(45) Date of Patent: Feb. 22, 2011

(54) PHOTODETECTOR INTEGRATED CHIP

(75) Inventor: Tomotaka Fujisawa, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/181,301

(22) PCT Filed: Nov. 13, 2001

(86) PCT No.: PCT/JP01/09919

§ 371 (c)(1),
(2), (4) Date: Jan. 16, 2003

(87) PCT Pub. No.: WO02/39507

PCT Pub. Date: May 16, 2002

(65) Prior Publication Data

US 2004/0075153 A1  Apr. 22, 2004

(30) Foreign Application Priority Data

Nov. 13, 2000 (JP) ............................. 2000-345358

(51) Int. Cl.
*H01L 21/02* (2006.01)
(52) U.S. Cl. .................. 257/437; 438/72; 257/E31.121
(58) Field of Classification Search ......... 257/291–293, 257/186, E33.076, E31.115, E31.121, 437, 257/290; 438/57, 69, 72
See application file for complete search history.

(56) References Cited

U.S. PATENT DOCUMENTS 4,127,932 A  12/1978  Hartman et al.

(Continued)

FOREIGN PATENT DOCUMENTS

CA  2 360 998  3/1978

(Continued)

OTHER PUBLICATIONS

Japanese Office Action issued on May 11, 2010 in connection with counterpart JP Application No. 2000-345358.

*Primary Examiner*—Thao X Le
*Assistant Examiner*—WIlliam F Kraig
(74) *Attorney, Agent, or Firm*—SNR Denton US LLP

(57) ABSTRACT

There are provided a semiconductor device including a photo receiving region having high photosensitivity by forming an antireflection film capable of both decreasing a reflectance and lowering a surface level density, and a manufacturing method of the semiconductor device. The semiconductor device includes an antireflection film 8 comprised of a laminated film including a first insulating film 6 formed on the surface of a silicon substrate 1 and a second insulating film 7 having a refractive index different from that of the first insulating film 6 formed above the first insulating film in a light-receiving area 10 of a semiconductor photo receiving region PD, and in which the first insulating film 6 is comprised of a silicon oxide film formed by oxidizing silicon on the surface of the semiconductor photo receiving region PD. Further, the semiconductor photo receiving region PD has a configuration such that it may receive light having a wavelength 500 nm or less. Furthermore, when this semiconductor device is manufactured, in the state in which the silicon surface which serves as a light-receiving portion of the photodiode PD is exposed, the silicon oxide film 6 is formed by thermally oxidizing silicon in the atmosphere of oxygen gas or in the atmosphere of mixed gas of oxygen and hydrogen at a temperature of 800° C. or more.

19 Claims, 5 Drawing Sheets

U.S. PATENT DOCUMENTS

| | | | |
|---|---|---|---|
| 4,616,247 A * | 10/1986 | Chang et al. | 257/438 |
| 5,262,667 A * | 11/1993 | Hirai | 257/435 |
| 5,424,222 A | 6/1995 | Arndt | |
| 5,585,653 A * | 12/1996 | Nakashiba | 257/232 |
| 5,602,415 A * | 2/1997 | Kubo et al. | 257/443 |
| 5,644,124 A * | 7/1997 | Hamada et al. | 250/216 |
| 6,005,276 A * | 12/1999 | Forrest et al. | 257/432 |
| 6,060,732 A * | 5/2000 | Murakami et al. | 257/215 |
| 6,166,405 A * | 12/2000 | Kuriyama et al. | 257/290 |
| 6,218,719 B1 * | 4/2001 | Tsang | 257/461 |
| 6,222,200 B1 * | 4/2001 | Svilans | 257/18 |
| 6,252,286 B1 * | 6/2001 | Arai | 257/446 |
| 6,362,019 B1 * | 3/2002 | Kuriyama | 438/60 |
| 6,379,993 B1 * | 4/2002 | Nakano et al. | 438/75 |
| 6,433,366 B1 * | 8/2002 | Takimoto et al. | 257/83 |
| 6,437,311 B2 * | 8/2002 | Tsang | 250/214.1 |
| 6,448,595 B1 * | 9/2002 | Hsieh et al. | 257/292 |
| 6,521,968 B2 * | 2/2003 | Kuhara et al. | 257/461 |
| 6,580,095 B2 * | 6/2003 | Tani et al. | 257/79 |
| 6,583,438 B1 * | 6/2003 | Uchida | 257/59 |
| 6,590,242 B1 * | 7/2003 | Kozuka et al. | 257/292 |
| 6,803,249 B2 * | 10/2004 | Thomas et al. | 438/59 |
| 7,307,326 B2 * | 12/2007 | Hayashida et al. | 257/432 |
| 2002/0048837 A1 * | 4/2002 | Burke et al. | 438/48 |
| 2002/0109157 A1 * | 8/2002 | Rhodes | 257/222 |

FOREIGN PATENT DOCUMENTS

| | | |
|---|---|---|
| CA | 1 078 948 | 6/1980 |
| DE | 27 34 726 | 2/1978 |
| DE | 43 06 565 A1 | 9/1994 |
| GB | 1 561 953 | 3/1980 |
| JP | 53-41193 | 4/1978 |
| JP | 57-104275 | 6/1982 |
| JP | 63-151085 | 6/1988 |
| JP | 07-7173 | 1/1995 |
| JP | 09-298308 | 11/1997 |
| JP | 10-084102 | 3/1998 |
| JP | 10-84102 | 3/1998 |
| JP | 10-107312 | 4/1998 |
| JP | 10-135506 | 5/1998 |

* cited by examiner

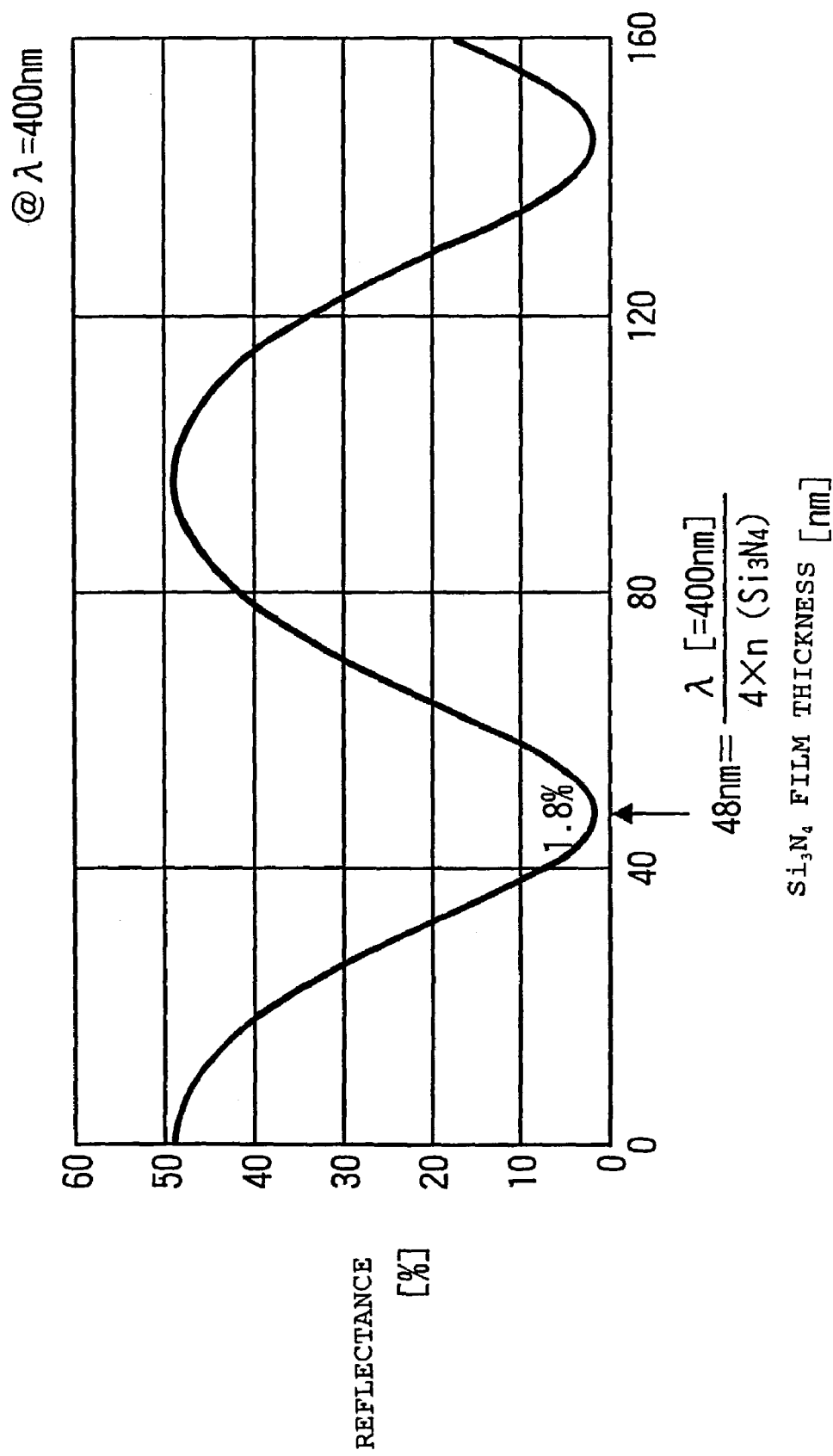

PHOTODETECTOR INTEGRATED CHIP

TECHNICAL FIELD

The present invention relates to a semiconductor device including a semiconductor photo receiving region such as a photodiode and a manufacturing method thereof.

BACKGROUND OF THE INVENTION

A photodiode, which serves as a photo receiving region, is generally known as an optical sensor for converting a light signal into an electric signal and is widely used as an optical sensor for control in a variety of photoelectric conversion devices.

Heretofore, on the surface of such a photodiode, an insulating film such as an $SiO_2$ (SiO) film has been deposited in order to protect the surface of the photodiode and also in order to suppress incident light reflected on the surface of the photodiode as much as possible.

In recent years, as a storage capacity increases and a transfer rate increases, a wavelength of laser light for use in reproducing and recording information becomes increasingly shorter in an information recording medium such as an optical disc.

However, as a wavelength of laser light becomes shorter, an absolute photosensitivity of a photo receiving region is lowered increasingly. An absolute photosensitivity obtained at about a laser light $\lambda=400$ nm in wavelength becomes approximately half of a photosensitivity of infrared rays ($\lambda=780$ nm) used in the existing optical discs.

The reason for this is that, when it is assumed that one hundred percent of light is absorbed in the silicon of the photodiode and then one hundred percent of absorbed light is photoelectrically converted into an electric signal, a photosensitivity S is expressed by the following equation (1) and this photosensitivity is proportional to a wavelength of incident light.

$$S = q\lambda/hc \quad (1)$$

where q represents the amount of electric charge per electron, $\lambda$ represents the wavelength of the incident light, h represents the Planck constant and c represents the light velocity.

Therefore, in order to increase a photosensitivity as much as possible in response to a laser light having a shorter wavelength, it is aimed to decrease the reflectance of laser light on the surface of the light-receiving portion to zero percent, i.e., the surface of the light-receiving portion should be made substantially equivalent to the non-reflection state such that substantially one hundred percent of light can be absorbed into the silicon.

First, a minimum reflectance R (min) at a wavelength $\lambda$ and a film thickness T (min) of an antireflection film used in this case are expressed by the following equations (2) and (3) respectively, where the antireflection film is made of a single layer. Note that $n_1$ assumes a refractive index of the antireflection film and $n_2$ assumes a refractive index of the silicon. Also assumed that nitrogen gas (refractive index is approximately 1) is existing between a light source and the antireflection film, $$R(min) = (1 \times n_2 - n_1^2)^2 / (1 \times n_2 + n_1^2) \quad (2)$$

$$T(min) = \lambda/(4 \times n_1) \quad (3)$$

A film having a thickness expressed by the above-mentioned equation (3) is generally called a quarter-wave film.

A study of the above-mentioned equation (2) can reveal that the value of $n_1^2$ is required to be close to the value of $n_2$ as much as possible in order to make the reflectance R(min) as small as possible.

Having compared the reflectances R (min) of the insulating materials $SiO_2$ and $Si_3N_4$ which are frequently used in a silicon-based process, for example, we have the following comparison results.

Since a refractive index of Si $O_2$ is 1.47, a refractive index of $Si_3 N_4$ is 2.01 and a refractive index of silicon is 3.70 at a wavelength $\lambda=780$ nm, the results are $$R(min)SiO_2 = (3.70-1.47^2)^2/(3.70+1.47^2)^2 = 7.6\%$$

and $$R(min)SiO_2 = (3.70-2.01^2)^2/(3.70+2.01^2)^2 = 7.6\%$$

Subsequently, let us consider the minimum reflectances in the case of a wavelength $\lambda=400$ nm in a similar fashion Since the refractive index of $SiO_2$ is 1.47, the refractive index of $Si_3N_4$ is 2.07 and the refractive index of silicon is 5.60 at the wavelength $\lambda=400$ nm, the results are R (min) $SiO_2=(5.60-1.47^2)^2/(5.60+1.47^2)^2=19.5\%$ and R (min) $Si_3N_4=(5.60-2.07^2)^2/(5.60+2.072^2)^2=1.8\%$.

FIG. 4 shows the change in reflectance of the antireflection film having the single layer of a silicon oxide film ($SiO_2$ film) at the wavelength of 400 nm when the film thickness of the antireflection film is changed.

It is understood in FIG. 4 that reflectance of the antireflection film having the single layer of the silicon oxide film (Si $O_2$) is minimized to obtain the above mentioned reflectance of 19.5% when the film thickness satisfied $\lambda(1+N)/(4 \times n(Si\ O_2))$ =68 nm, 204 nm, 340 nm, ... with N=0, 1, 2, ....

FIG. 5 shows the change in reflectance of the antireflection film having the single layer of a silicon nitride film ($Si_3N_4$ film) at the wavelength of 400 nm when the film thickness of the antireflection film is changed.

It is understood in FIG. 5 that reflectance of the antireflection film having the single layer of the silicon nitride film ($Si_3 N_4$) is minimized to obtain the above mentioned reflectance of 1.8% when the film thickness satisfied $$\lambda(1+2N)/(4 \times n(Si_3N_4)) = 48\ nm,\ 145\ nm,\ 242\ nm,\ \ldots$$
with N=0, 1, 2, ...

Specifically, it is to be understood that when the antireflection film having the single layer of the $Si_3N_4$ film is formed in the selected film thickness, the reflectance can be considerably lowered at any wavelengths as compared with the case in which the antireflection film has the single layer of $SiO_2$ film.

However, in the existing technology of silicon-based process, a method of depositing an $Si_3N_4$ film relies on only a CVD (chemical vapor deposition) method so that a surface level density of a silicon interface tends to increase.

In the actual photoelectric conversion by photodiode, carriers to be photoelectrically converted decrease due to a recombination of carriers on the surface.

Accordingly, when the surface level density increases as described above, a ratio at which the carriers are recombined on the surface increases so that a ratio of effective carriers to be photoelectrically converted decreases.

In particular, as the wavelength of light becomes shorter, a ratio of photoelectrical conversion in a shallow area increases so that an influence exerted due to the surface level becomes great.

Specifically, assuming that $\alpha$ is an absorption coefficient of light at the wavelength $\lambda$, the absorption coefficient $\alpha$ increases as the wavelength $\lambda$ becomes short. For example, at a wavelength of 400 nm, $\alpha=7.8\times10^4$/cm is satisfied. At a wavelength of 780 nm, $\alpha=1.1\times10^3$/cm is satisfied.

Assuming that Pio is light intensity on the silicon surface, light intensity Pix in a depth x is expressed by the following equation (4):

$$Pix=Pio\cdot\exp(-\alpha x) \qquad (4)$$

Since the absorption coefficient $\alpha$ increases as the wavelength $\lambda$ becomes short as described above, this light intensity Pix is lowered as the wavelength $\lambda$ becomes short.

Therefore, as the wavelength becomes short, the light intensity is considerably attenuated according to the depth. As a result, the ratio at which carriers are to be photoelectrically converted in the shallow area increases.

In actual practice, in the case of the antireflection film having the single layer of the $Si_3N_4$ film deposited by a low-pressure CVD method, it is observed that a photosensitivity in the short-wavelength range (laser wavelength $\lambda$<500 nm) suddenly declined.

In order to solve the above-mentioned problems, according to the present invention, there are provided an antireflection film capable of both decreasing a reflectance and lowering a surface level density on a photo receiving region of a semiconductor device to obtain a semiconductor device including a photo receiving region having high photosensitivity and a manufacturing method therefor.

SUMMARY OF THE INVENTION

A semiconductor device according to the present invention includes at least a semiconductor photo receiving region on a silicon substrate, at least a light-receiving area of which contains a antireflection film comprised of a laminated film having more than one layer including a first insulating film formed on the surface of the silicon substrate and a second insulating film having a refractive index different from that of the first insulating film formed on the first insulting film, and the first insulating film is comprised of a silicon oxide film which is formed by at least oxidizing silicon on the surface of the semiconductor photo receiving region.

According to the above-mentioned configuration of the semiconductor device of the present invention, since the first insulating film is comprised of a silicon oxide film formed by at least oxidizing the silicon on the surface of the semiconductor photo receiving region, the level of the silicon surface of the semiconductor photo receiving region can be lowered.

Further, since the antireflection film has the configuration such that the second insulating film whose refractive index is different from that of the first insulating film is formed on the first insulating film, it becomes possible to optimize the reflectance of the antireflection film by adjusting the film thicknesses of the first and second insulating films.

A semiconductor device manufacturing method according to the present invention includes a process of forming a silicon oxide film by thermally oxidizing silicon in the atmosphere of oxygen gas or in the atmosphere of mixed gas of oxygen and hydrogen at a temperature of 800° C. or more in the state where at least a silicon surface, which serves as a light-receiving portion of a photodiode, is exposed and a process of forming a silicon nitride film on the silicon oxide film, and the method allows at least the silicon oxide film and the silicon nitride film to be finally left on the surface of the photodiode as the antireflection film.

According to the above-mentioned manufacturing method of the present invention, since the silicon oxide film is formed by thermally oxidizing silicon in the atmosphere of oxygen gas or in the atmosphere of mixed gas of oxygen and hydrogen at a temperature of 800° C. or more in the state where the silicon surface, which serves as the light-receiving portion of the photodiode, is exposed, the level of the surface of the photodiode can be lowered by the thermal oxidation.

Further, since the above-mentioned manufacturing method of the present invention includes a process of forming the silicon nitride film on the silicon oxide film to allow at least the silicon oxide film and the silicon nitride film to be finally left on the surface of the photodiode as the antireflection film, there may be formed the antireflection film which can optimize the above-mentioned reflectance.

A semiconductor device according to the present invention includes at least a semiconductor photo receiving region for receiving light having at least a wavelength 500 nm or less on a silicon substrate, at least a light-receiving area of the semiconductor photo receiving region contains an antireflection film comprised of a laminated film having more than one layer including a first insulating film formed on the surface of the silicon substrate and a second insulating film having a refractive index different from that of the first insulating film formed on the first insulating film, and the first insulating film is comprised of a silicon oxide film which is formed by at least oxidizing silicon on the surface of the semiconductor photo receiving region.

According to the above-mentioned configuration of the semiconductor device of the present invention, since the first insulating film is comprised of the silicon oxide film formed by at least oxidizing the silicon on the surface of the semiconductor photo receiving region which receives light having a wavelength 500 nm or less, the level of the silicon surface of the semiconductor photo receiving region can be lowered.

Further, since the antireflection film has the configuration such that the second insulating film whose refractive index is different from that of the first insulating film is formed on the first insulating film, it becomes possible to optimize the reflectance of the antireflection film by adjusting the film thicknesses of the first and second insulating films.

BRIEF DESCRIPTION OF DRAWINGS

FIG. 5 is a characteristic graph showing the manner in which a reflectance of an antireflection film is changed at the wavelength of 400 nm when a film thickness of an antireflection film having a single layer of a silicon nitride film ($Si_2N_4$ film) is changed.

DETAILED DESCRIPTION OF THE PRESENTLY PREFERRED EMBODIMENTS

Figure 1:
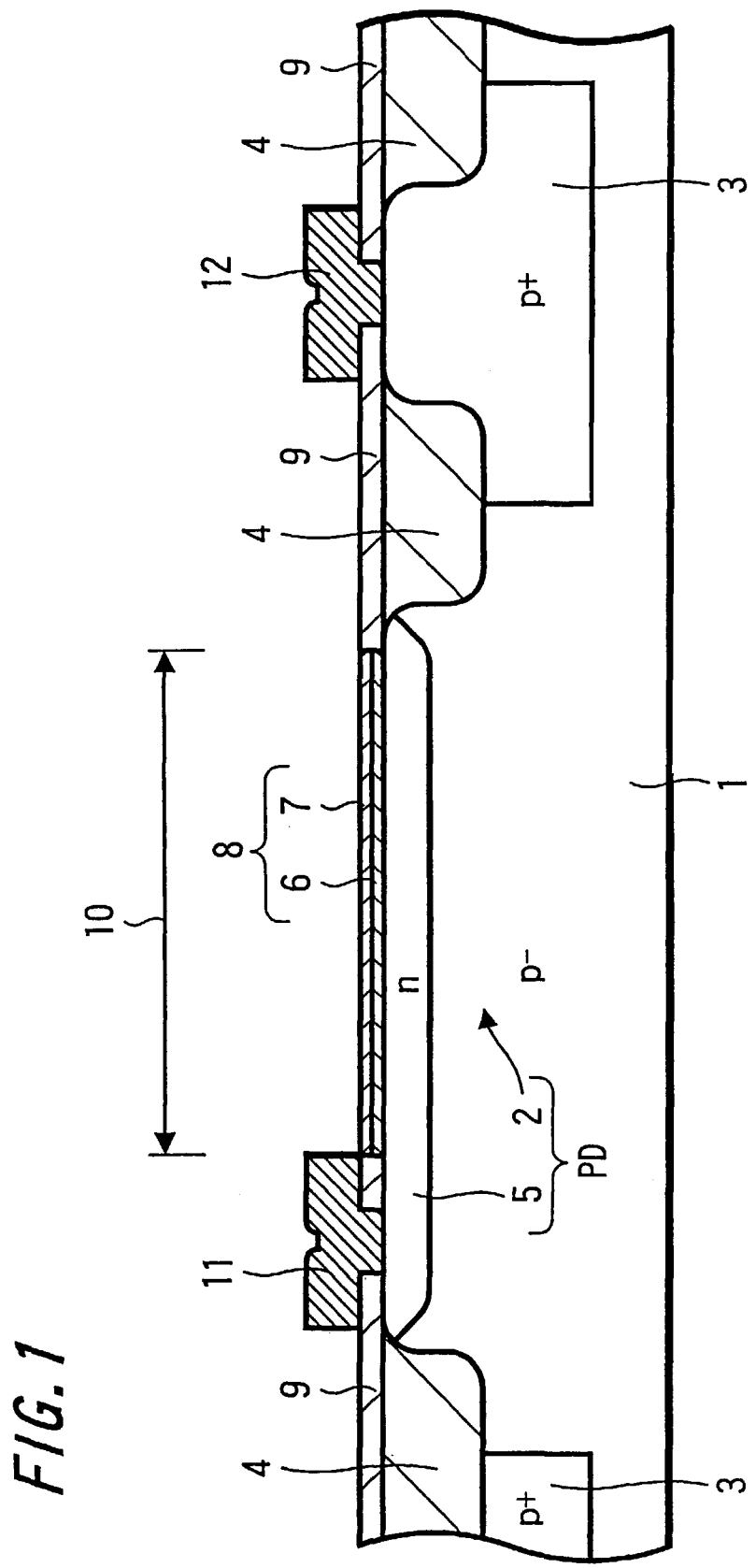
FIG. 1 is a cross-sectional view of a main portion of a semiconductor device according to an embodiment of the present invention.

According to the present invention, there is provided a semiconductor device including at least a semiconductor photo receiving region formed on a silicon substrate. This semiconductor device includes an antireflection film containing a laminated film having more than one layer including a first insulating film formed on the surface of the silicon substrate and a second insulating film having a refractive index different from that of the first insulating film formed on the first insulating film in at least a light-receiving area of the semiconductor photo receiving region, and in which the first insulating film is comprised of a silicon oxide film formed by at least oxidizing the silicon on the surface of the semiconductor photo receiving region.

According to the configuration of the present invention, the film thickness of the silicon oxide film is 50 nm or less in the above-described semiconductor device.

According to the configuration of the present invention, the film thickness of the silicon oxide film is 5 nm or more and 25 nm or less in the above-described semiconductor device.

Further, according to the configuration of the present invention, in the above-described semiconductor device, the first insulating film is a silicon oxide film formed by thermally oxidizing at least silicon on the surface of the semiconductor photo receiving region in the atmosphere of at least oxygen gas or in the atmosphere of mixed gas of oxygen and hydrogen at a temperature of 800° C. or more.

Furthermore, according to the present invention, the second insulating film is a silicon nitride film in the above-described semiconductor device.

According to the present invention, there is provided a semiconductor device manufacturing method including a process of forming a silicon oxide film by thermally oxidizing silicon in the atmosphere of oxygen gas or in the atmosphere of mixed gas of oxygen and hydrogen at a temperature of 800° C. or more in the state where at least the silicon surface, which serves as the light-receiving portion of the photodiode, is exposed and a process of forming a silicon nitride film on the silicon oxide film, and in which at least the silicon oxide film and the silicon nitride film are finally left on the surface of the photodiode as the antireflection film.

Further, according to the present invention, in the above-described semiconductor device manufacturing method, the silicon oxide film is formed by a low-pressure CVD method.

Furthermore, according to the present invention, in the above-described semiconductor device manufacturing method, the film thickness of the silicon oxide film is 50 nm or less.

According to the present invention, there is provided a semiconductor device including a semiconductor photo receiving region for receiving light having at least a wavelength of 500 nm or less on a substrate. This semiconductor device includes an antireflection film containing a laminated film having more than one layer including a first insulating film formed on the surface of a silicon substrate and a second insulating film having a refractive index different from that of the first insulating film formed on the first insulating film in at least the light-receiving area of the semiconductor photo receiving region, and in which the first insulating film is comprised of a silicon oxide film formed by at least oxidizing the silicon on the surface of the semiconductor photo receiving region.

According to the configuration of the present invention, the film thickness of the silicon oxide film is 50 nm or less in the above-described semiconductor device.

According to the configuration of the present invention, the film thickness of the silicon oxide film is 5 nm or more and 25 nm or less in the above-described semiconductor device.

Further, according to the present invention, in the above-described semiconductor device, the first insulating film is a silicon oxide film formed by thermally oxidizing the silicon on the surface of the semiconductor photo receiving region at least in the atmosphere of oxygen gas or in the atmosphere of mixed gas of oxygen and hydrogen at a temperature of 800° C. or more.

Furthermore, according to the configuration of the present invention, the second insulating film is a silicon nitride film in the above-described semiconductor device.

FIG. 1 shows a cross-sectional view of a main portion of a semiconductor device according to an embodiment of the present invention.

This semiconductor device is comprised of a silicon substrate 1 and a semiconductor photo receiving region comprised of a photodiode PD formed on the surface of the silicon substrate.

This photodiode PD comprises a pn photodiode having a p⁻ area 2 which serves as an anode formed on the silicon substrate 1 and an n area 5 formed near the surface of the silicon substrate 1 which serves as a cathode. Then, this photodiode PD is formed on the area isolated by an element isolating layer 4 having a LOCOS oxide film or the like near the surface of the silicon substrate 1.

This photodiode PD photoelectrically converts light incident thereon from above to provide an electric signal corresponding to the amount of incident light.

A p⁺ area 3 is formed on the silicon substrate 1 of other area isolated by the element isolating layer 4. This p⁺ area 3 is connected to the p⁻ area 2, which is the anode, to serve as an electrode read-out area.

An interlayer insulating film 9 is formed on the surface of the silicon substrate 1. This interlayer insulating film 9 has openings at portions of the light-receiving area 10 on the photodiode PD, the end of the n area 5 and the p⁺ area 3.

Through the openings of this interlayer insulating film 9, a cathode read-out electrode 11 is connected to the end portion of the n area 5 which is the cathode, and an anode read-out electrode 12 is connected to the p⁺ area 3.

In this embodiment, an antireflection film 8 is formed on, in particular, the light-receiving area 10 of the photodiode PD. This antireflection film 8 is comprised of a thin $SiO_2$ film (SiO film), i.e., silicon oxide film 6 which are formed by thermally oxidizing silicon and an $Si_3N_4$ film (SiN film), i.e., silicon nitride film 7.

The silicon oxide film 6 is formed by oxidizing the silicon surface in the state where at least the silicon surface serving as the light-receiving portion of photodiode PD is exposed.

The silicon oxide film should preferably be formed by thermally oxidizing the silicon on the surface of the silicon substrate 1 in the atmosphere of oxygen gas or in the atmosphere of mixed gas of oxygen and hydrogen at a temperature of 800° C. or more, e.g., 900° C.

Since this silicon oxide film 6 is formed by oxidizing the silicon surface, it is possible to lower the level density on the silicon surface.

The film thickness of the silicon oxide film 6 formed by oxidizing the silicon surface should preferably be selected to be 50 nm or less and should be more preferably selected to be 5 nm or more and 25 nm or less.

The silicon nitride film 7 is deposited on the silicon oxide film 6 by using a low-pressure CVD (chemical vapor deposition) method or the like, after the silicon oxide film 6 has been deposited.

Since the silicon nitride film 7 deposited on the silicon oxide film 6 has the refractive index which is larger than that of the silicon oxide film 6, the silicon nitride film 7 is laminated on the silicon oxide film to efficiently decrease the reflectance as compared with the case in which the antireflection film is comprised of the single layer of the silicon oxide film.

Further, by selecting the film thickness of the silicon oxide film 6 and the film thickness of the silicon nitride film 7, it becomes possible to considerably decrease a reflectance in a certain wavelength.

Therefore, design of the film thickness of the silicon oxide film 6 and silicon nitride film 7 allows the antireflection film to be optimized by decreasing the reflectance relative to a target wavelength of light.

This point will be described below with reference to a specific example.

Let us consider the case in which the wavelength $\lambda$ of incident light is equal to 400 nm as a specific example.

Figure 2:
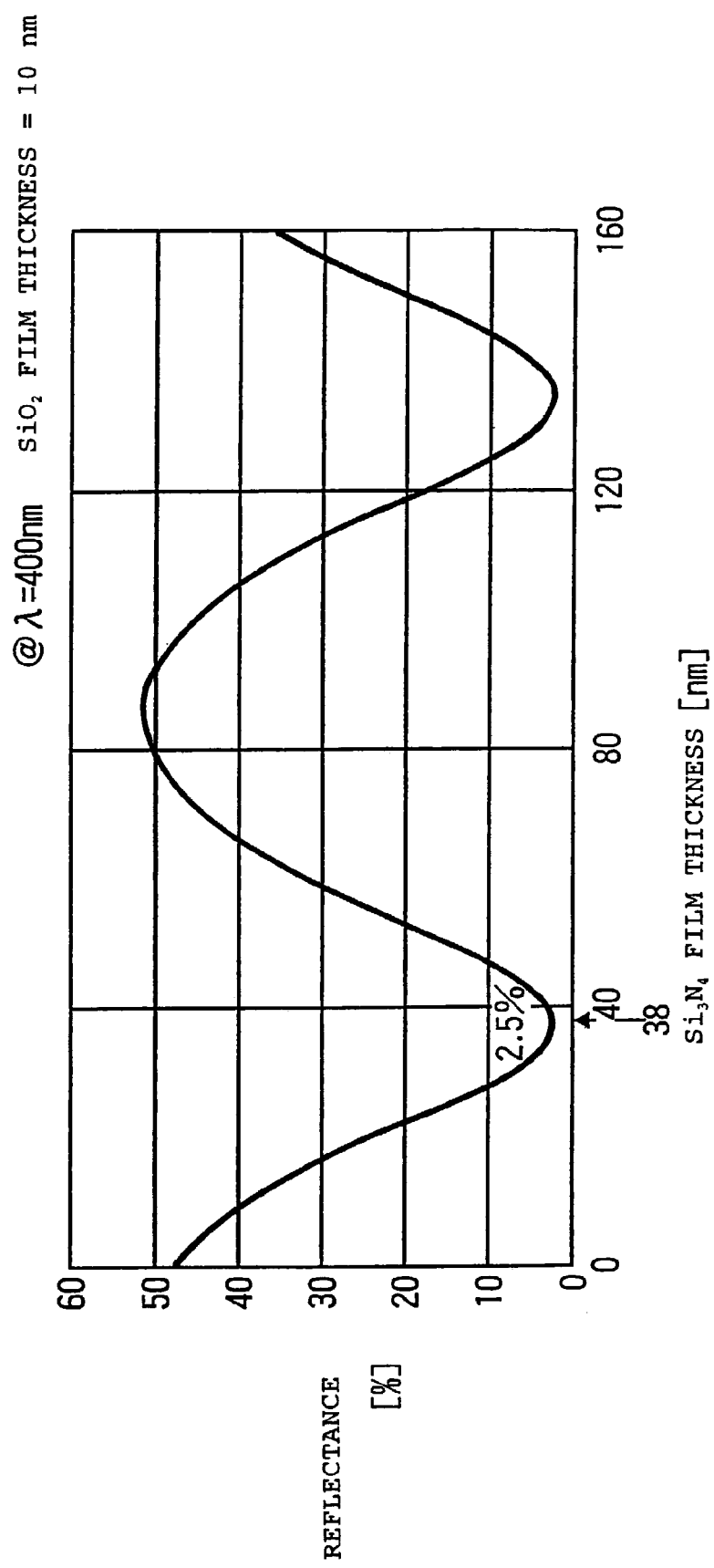
FIG. 2 is a characteristic graph showing the manner in which a reflectance of an antireflection film is changed at the wavelength of 400 nm when a film thickness of a silicon nitride film ($Si_3N_4$ film) in the antireflection film shown in FIG. 1 is changed.

First, there is provided an antireflection film 8 comprising a silicon oxide film 6 having a film thickness of 10 nm and a silicon nitride film 7 on the silicon oxide film 6. FIG. 2 shows the manner in which the reflectance of the antireflection film 8 is changed when the film thickness of the silicon nitride film ($Si_3N_4$ film) 7 is changed at that time.

It is to be understood in FIG. 2 that the reflectance is decreased to 2.5% when the film thickness of the silicon nitride film ($Si_3N_4$ film) 7 is selected to be 38 nm.

It is also to be understood that a reflectance of the antireflection film 8 has a periodicity regarding the film thickness dependence.

Then, it is to be understood that a reflectance can be decreased most when the following equation (5) is satisfied with respect to a film thickness t ($Si_3N_4$) of the silicon nitride film ($Si_3N_4$ film) 7.

$$t(Si_3N_4)=38+2N\times\lambda/(4\times n(Si_3N_4))[nm] \quad (5)$$

(where N=0, 1, 2, ...)

Thus, it is clear that an antireflection effect similar to that obtained when the film thickness of the silicon nitride film is selected to be 38 nm can be achieved by designing the silicon nitride film 7 so as to have the film thickness expressed by the equation (5).

However, in actual practice, from a film thickness control standpoint, to design the silicon nitride film having the smallest film thickness (N=0; in this case, the film thickness is 38 nm) is favorable for stabilizing reflectance most.

Next, by using the method shown in FIG. 2, a film thickness in which a reflectance can be decreased most was examined when the film thickness of the silicon nitride film 7 is changed and the film thickness of the silicon oxide film 6 was fixed to a certain film thickness in the range of 0 nm (this case is the same as the case of the silicon nitride film having single layer shown in FIG. 5) to 30 nm in which the film thickness of the silicon oxide film 6 falls.

Figure 3:
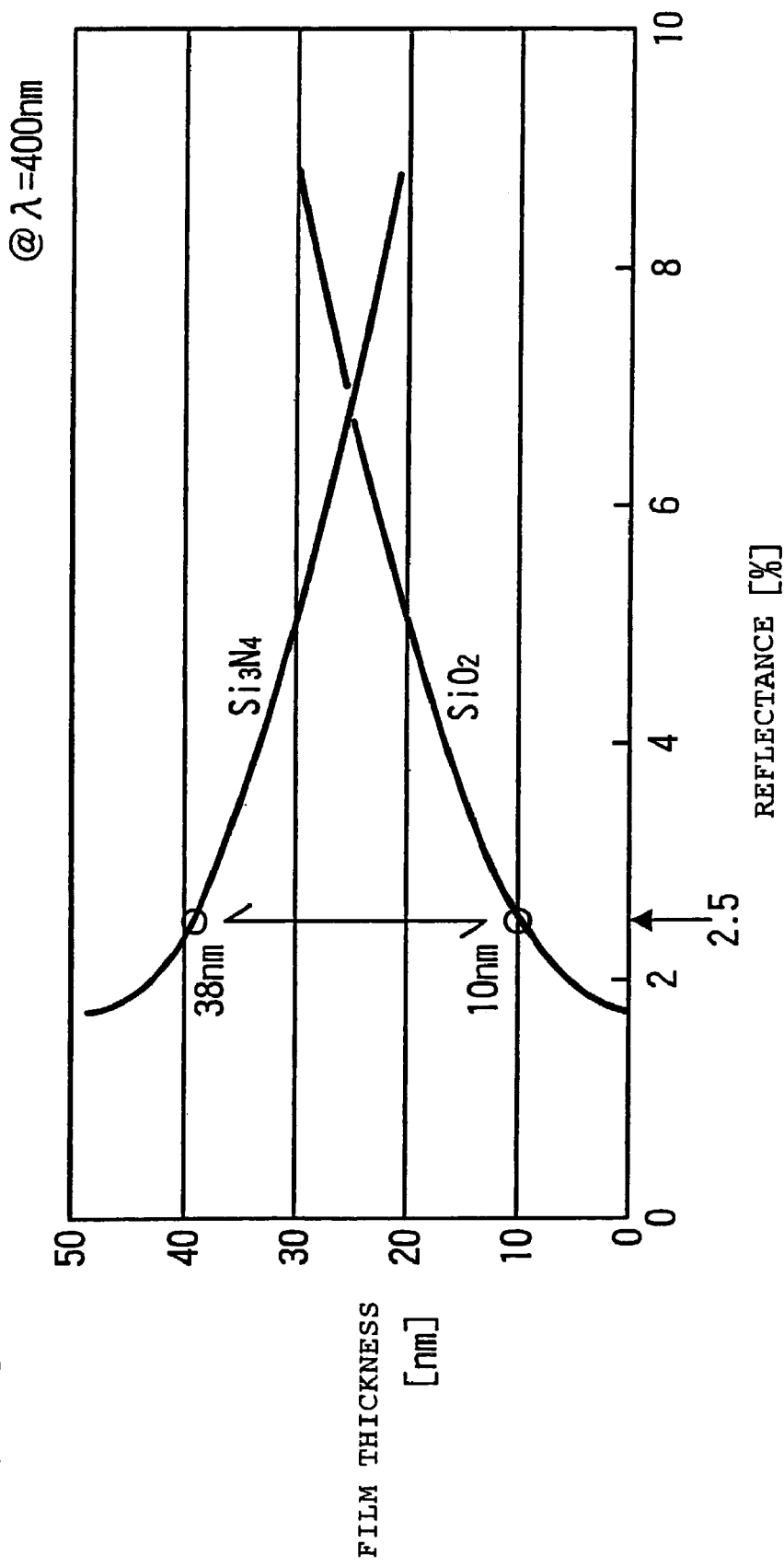
FIG. 3 is a characteristic graph showing a relationship between each film thickness and a reflectance of an antireflection film at the wavelength of 400 nm when a film thickness of a silicon oxide film ($SiO_2$ film) and a film thickness of a silicon nitride film ($Si_3N_4$ film) are optimized in the antireflection film shown in FIG. 1.
Figure 4:
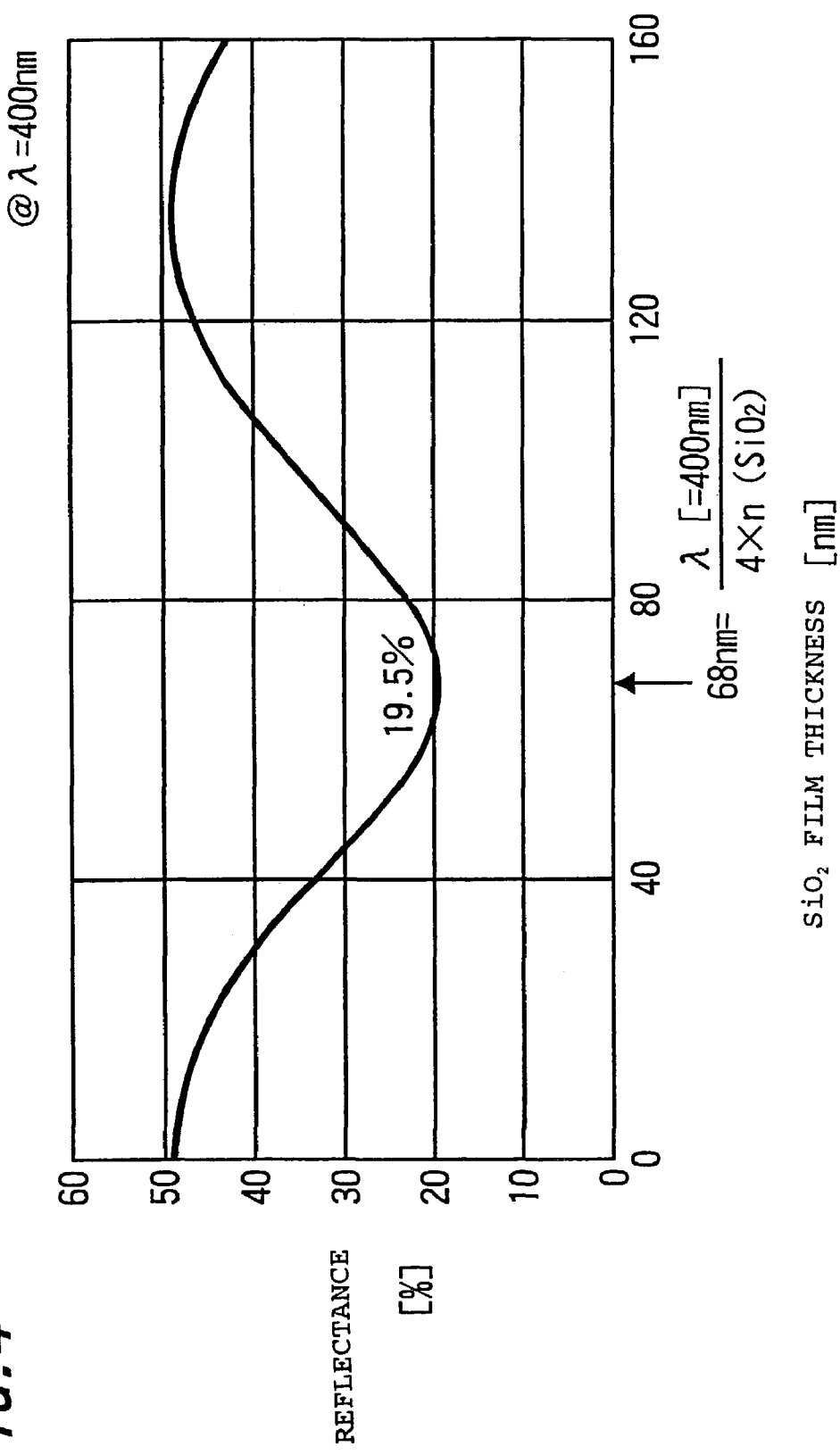
FIG. 4 is a characteristic graph showing the manner in which a reflectance of an antireflection film is changed at the wavelength of 400 nm when a film thickness of an antireflection film having a single layer of a silicon oxide film ($SiO_2$ film) is changed.

FIG. 3 shows measured results of such examination where the horizontal axis represents the reflectance and the vertical axis represents the film thickness of the silicon oxide film 6 and the film thickness of the silicon nitride film 7.

A study of FIG. 3 reveals that the reflectance is decreased to 2.5% when the film thickness of the aforementioned silicon oxide film 6 is 10 nm and the film thickness of the silicon nitride film 7 is 38 nm.

A lower limit of a reflectance obtained in the case shown in FIG. 3 is 1.8% obtained when the silicon nitride film 7 having the single layer has a film thickness of 48 nm.

By making effective use of measured results of FIG. 3, it is possible to design the film thickness of the silicon oxide film 6 and the film thickness of the silicon nitride film 7 in response to a required reflectance.

While FIG. 3 shows measured results obtained when the wavelength $\lambda$=400 nm, the present invention is not limited thereto, and a film thickness can be designed by making a similar characteristic graph with respect to other wavelengths.

According to the above-mentioned embodiment, since the antireflection film 8 is comprised of the laminated film of the silicon oxide film 6 and the silicon nitride film 7, it is possible to decrease the reflectance as compared with the case in which the antireflection film is comprised of the silicon oxide film 6 having the single layer.

Then, by designing the film thickness of the silicon oxide film 6 and the film thickness of the silicon nitride film 7, it becomes possible to obtain the optimized antireflection film by decreasing a reflectance relative to a target wavelength of light.

Further, since the silicon oxide film 6 is deposited by oxidizing, e.g., thermally oxidizing the silicon surface, the level of the silicon surface is lowered by the oxidation.

Therefore, since a recombination of carries on the surface due to the surface level state can be decreased, a ratio of carriers to be photoelectrically converted can be increased and hence a desired sensitivity can be maintained in the photodiode.

That is, according to this embodiment, it becomes possible to decrease the reflectance as well as to decrease the recombination of carriers on the surface.

Therefore, it becomes possible to increase a photosensitivity, in particular, in a short wavelength range.

The area in which the antireflection film 8 is formed is not always in conformity with the light-receiving area as shown in FIG. 1. The antireflection film 8 is required to be formed on at least the light-receiving area 10.

The antireflection film is not limited to the two-layer structure of the above-mentioned embodiment and the antireflection film may be comprised of a laminated film having three layers or more in which films different from the silicon oxide film 6 serving as the first insulating film and the silicon nitride film 7 serving as the second insulating film are further included. When the antireflection film is comprised of the laminated film having more than three layers, the silicon oxide film 6 of the first insulating film is laid as the lowermost layer because this silicon oxide film is deposited by thermally oxidizing the silicon.

While the present invention is applied to the semiconductor device including the single photodiode PD according to the above-mentioned embodiment, it is clear that the present invention can also be applied to a so-called photodetector IC (PDIC) including an IV amplifying circuit or the like on the same substrate, for example.

The present invention is not limited to the above-mentioned embodiment and can take various modifications without departing from the gist of the present invention.

According to the above-mentioned present invention, since it becomes possible to design the antireflection film of the photodiode in such a fashion that the reflectance may be optimized in response to the target wavelength of light, the reflectance on the surface of the photodiode can be decreased.

Further, according to the present invention, since the silicon surface is oxidized, e.g., thermally oxidized, the level of the silicon surface can be lowered.

Therefore, according to the present invention, the reflectance can be decreased and the recombination of the carriers due to the surface level on the surface of the photodiode can be decreased simultaneously, whereby the photosensitivity can be improved.

In particular, the photosensitivity is efficiently improved in the short wavelength range in which the wavelength $\lambda$ satisfies an inequality of $\lambda < 500$ nm wherein the photoelectric conversion is executed near the surface of the photodiode.

DESCRIPTION OF REFERENCE NUMERALS

1 ... silicon substrate
2 ... p⁻ area (anode)
3 ... p⁺ area
4 ... element isolating layer
5 ... n area (cathode)
6 ... silicon oxide film
7 ... silicon nitride film
8 ... antireflection film
9 ... interlayer insulating film
10 ... light-receiving area (of photodiode)
11 ... cathode lead-out electrode
12 ... anode lead-out electrode
PD ... photodiode

The invention claimed is:

1. A photodetector integrated chip comprising:
a semiconductor photo receiving region on a silicon substrate having an upper light-receiving surface;
an insulating layer on said surface of said silicon substrate; and
an antireflection film comprising a laminated film, having a first insulating film formed on said upper light-receiving surface of said silicon substrate and a second insulating film having a refractive index different than that of said first insulating film formed on said first insulating film, is formed at least in a light-receiving area of said semiconductor photo receiving region,
wherein,
said first insulating film is comprised of a silicon oxide film formed by at least oxidizing silicon on the upper light-receiving surface of said semiconductor photo receiving region,
said second insulating film is formed at a top of said semiconductor photo receiving region, the second insulating film having no insulation element formed thereon, and
the thickness of the second insulating film is based on the thickness of the first insulating film and a wavelength of a light to be detected so as to minimize reflectance of the light at that wavelength, and
the light to be detected has a wavelength of less than 500 nm.

2. The photodetector integrated chip according to claim 1, wherein said silicon oxide film has a film thickness of 50 nm or less.

3. The photodetector integrated chip according to claim 1, wherein said silicon oxide film has a film thickness of 5 nm or more and 25 nm or less.

4. The photodetector integrated chip according to claim 1, wherein said first insulating film is a silicon oxide film formed by thermally oxidizing silicon on the surface of said semiconductor photo receiving region at least in the atmosphere of oxygen gas or in the atmosphere of mixed gas of oxygen and hydrogen at a temperature of 800° C. or more.

5. The photodetector integrated chip according to claim 1, wherein said second insulating film is a silicon nitride film.

6. The photodetector integrated chip according to claim 1, wherein each of said first insulating film and said second insulating film are of a substantially equal thickness and length.

7. The photodetector integrated chip according to claim 1, wherein said insulating layer and said antireflection film are formed not to overlap each other.

8. A photodetector integrated chip comprising:
a semiconductor photo receiving region for receiving light having at least a wavelength of 500 nm or less on a silicon substrate having an upper light-receiving surface;
an insulating layer on said upper light-receiving surface of said silicon substrate; and
an antireflection film comprising a laminated film, having a first insulating film formed on said upper light-receiving surface of said silicon substrate and a second insulating film having a refractive index different than that of said first insulating film formed on said first insulating film, is formed at least in a light-receiving area of said semiconductor photo receiving region,
wherein,
said first insulating film is comprised of a silicon oxide film formed by at least oxidizing silicon on the upper light-receiving surface of said semiconductor photo receiving region,
said second insulating film is formed at a top of said semiconductor photo receiving region, the second insulating film having no insulation element formed thereon, and
the thickness of the second insulating film is based on the thickness of the first insulating film and a wavelength of a light to be detected so as to minimize reflectance of the light at that wavelength, and
the light to be detected has a wavelength of less than 500 nm.

9. The photodetector integrated chip according to claim 8, wherein said silicon oxide film has a film thickness of 50 nm or less.

10. The photodetector integrated chip according to claim 8, wherein said silicon oxide film has a film thickness of 5 nm or more and 25 nm or less.

11. The photodetector integrated chip according to claim 8, wherein said first insulating film is a silicon oxide film formed by thermally oxidizing silicon on the surface of said semiconductor photo receiving region at least in the atmosphere of oxygen gas or in the atmosphere of mixed gas of oxygen and hydrogen at a temperature of 800° C. or more.

12. The photodetector integrated chip according to claim 8, wherein said second insulating film is a silicon nitride film.

13. The photodetector integrated chip according to claim 8, wherein a film thickness of said first insulating film and said second insulating film consists of said laminated film and is optimized to decrease an amount of light reflected.

14. The photodetector integrated chip according to claim 8, wherein said insulating layer and said antireflection film are formed not to overlap each other.

15. The photodetector integrated chip according to claim 8, wherein each of said first insulating film and said second insulating film are of a substantially equal thickness and length.

16. A photodetector integrated chip comprising:
a photo receiving region formed on a substrate having an upper light-receiving surface;

an insulating layer on said upper light-receiving surface of said substrate;

an electrode formed directly on said upper light-receiving surface of said photo receiving region; and an antireflection film comprising a laminated film, having a first insulating film formed on said upper light-receiving surface of said silicon substrate and a second insulating film having a refractive index different than that of said first insulating film and formed over the light receiving region, is formed at least in a light-receiving area of said semiconductor photo receiving region, wherein, said electrode formed in another opening of said insulating layer over the light-receiving surface of said photo receiving region, said first insulating film is comprised of a silicon oxide film formed by at least oxidizing silicon on the light-receiving surface of said semiconductor photo receiving region, said second insulating film is formed at a top of said semiconductor photo receiving region, the second insulating film having no insulation element formed thereon, and the thickness of the second insulating film is based on the thickness of the first insulating film and a wavelength of a light to be detected so as to minimize reflectance of the light at that wavelength, and the light to be detected has a wavelength of less than 500 nm.

17. The photodetector integrated chip according to claim 16, wherein said second insulating film is a silicon nitride film.

18. The photodetector integrated chip according to claim 16, wherein said insulating layer and said antireflection film are formed not to overlap each other.

19. The photodetector integrated chip according to claim 16, wherein each of said first insulating film and said second insulating film are of a substantially equal thickness and length.

* * * * *